United States Patent [19]
Deki et al.

[11] Patent Number: 5,274,340
[45] Date of Patent: Dec. 28, 1993

[54] MICROWAVE MULTISTAGE AMPLIFIER

[75] Inventors: Akihito Deki, Amagasaki; Yukiro Kashima, Takatsuki; Hirotaka Fujisaki, Neyagawa, all of Japan

[73] Assignee: Matsushita Electric Industrial Co., Ltd., Osaka, Japan

[21] Appl. No.: 847,087
[22] PCT Filed: Sep. 2, 1991
[86] PCT No.: PCT/JP91/01172
§ 371 Date: Apr. 13, 1992
§ 102(e) Date: Apr. 13, 1992
[87] PCT Pub. No.: WO92/04743
PCT Pub. Date: Mar. 19, 1992

[30] Foreign Application Priority Data

Sep. 3, 1990 [JP] Japan .................. 2-233501

[51] Int. Cl.$^5$ .............................. H03F 3/89
[52] U.S. Cl. ........................ 330/68; 330/286; 333/204; 333/246
[58] Field of Search ............ 330/56, 65, 66, 68, 330/286, 287; 333/204, 246, 247

[56] References Cited

U.S. PATENT DOCUMENTS 4,672,328  6/1987  Adachi et al. .............. 330/286

FOREIGN PATENT DOCUMENTS 2916393  11/1980  Fed. Rep. of Germany ........ 330/66
50-139653 11/1975 Japan .
59-174701 11/1984 Japan .
1-314408  12/1989 Japan .

OTHER PUBLICATIONS

Patent Abstracts of Japan, vol. 13, No. 136 (E-737)5 Apr. 5, 1989 Fujitsu Ltd., JP-A-63300597.

Primary Examiner—James B. Mullins
Attorney, Agent, or Firm—Stevens, Davis, Miller & Mosher

[57] ABSTRACT

In a microwave multistage amplifier, a shield casing (8) has a partition plate (7) integrally moulded with and disposed in the casing (8); microwave amplifiers (5, 6) are arranged on a dielectric substrate so as to locate the partition plate therebetween; and an upper cover plate (11) is provided which can be screwed to partition plate (7). By virtue of the above-mentioned arrangement, it becomes possible to strictly separate rooms defined in the casing from each other and suppress generation of a surface wave mode of the microwave propagation on the dielectric substrate, thereby assuring an isolation between the amplifiers.

4 Claims, 3 Drawing Sheets

MICROWAVE MULTISTAGE AMPLIFIER

TECHNICAL FIELD

The present invention relates to a microwave multistage amplifier used in a microwave communication system or the like.

BACKGROUND OF THE INVENTION

Recently, microwave multistage amplifiers used in a microwave communication systems have been required to have significantly high stability in providing operation essentially free from abnormal oscillations, which may be caused by environmental conditions or conditions of any other device connected to the amplifier. A solid-state element such as HEMT, MES-FET or the like used in the band range of the recent microwave has a high power gain, and when a microwave multistage amplifier is constructed by using such solid-state elements and there is no sufficient spatial isolation between the input terminal of the multistage amplifier and the output terminal of the same, there may be a fear of causing an abnormal oscillations of the multistage amplifier.

Referring to the attached drawings, a conventional microwave multistage amplifier of the above-mentioned type will be described below.

FIG. 5 shows a microwave multistage amplifier according to a prior art, and FIG. 6 is a sectional view thereof. In FIGS. 5 and 6, numerals 1, 2 and 3 denote micro strip lines, and numeral 4 denotes a dielectric substrate for forming a microwave circuit thereon. A microwave signal inputted through an input terminal 9 is sequentially amplified by microwave amplifiers 5 and 6, and then is outputted through an output terminal 10. The microwave signal amplified by the microwave amplifier 6 has a potential level higher than that of the microwave signal inputted through the input terminal 9. Therefore, under certain conditions of permittivity or thickness of the dielectric substrate, the microwave signal outputted from the microwave amplifier 6 is possibly transmitted to the micro strip line 1 as a surface wave mode or a strong spatial radiation, thereby causing an abnormal oscillation of the multistage amplifier.

In order to prevent the above-mentioned adverse phenomenon, it is required to provide spatial isolation between the input side and the output side of the microwave multistage amplifier. In detail, there are provided a partition plate 7 which is screwed or soldered to a earth pattern 16 mounted on the dielectric substrate 4 by means of a through hole 15, and an upper cover plate 11 which is fixed to the shield casing 8 by means of screws 12 and 13 for closing the opening of the casing 8.

In the above-mentioned structure, however, the upper cover plate 11 is not permitted to be screwed to the partition plate 7, because this screwing causes a deformation of the dielectric substrate 4 and, as a result, a crack in the earth pattern 16. In consequence, a gap remains between the upper cover plate 11 and the partition plate 7, which deteriorates the spatial isolation between the partitioned rooms in the casing.

Further, there exists a problem that a microwave is transmitted through in the dielectric substrate 4 in one room of the casing as a surface wave mode, excluding a TEM mode, and is transferred to the micro strip line 1 in the other room of the casing, thereby also deteriorating the isolation.

The object of the present invention is to overcome the above-mentioned problems, and to provide a microwave multistage amplifier having an excellent operational stability, in which any isolation deterioration due to the generation of a surface wave mode wave transmission through the dielectric substrate is prevented by strictly separating the rooms in the casing from each other.

DISCLOSURE OF THE INVENTION

For solving the above-mentioned problems, in a microwave multistage amplifier according to the present invention, the shield casing has the partition plate integrally moulded therewith; microwave amplifiers are arranged separately from each other so a to dispose the partition plate therebetween; and an upper cover plate is provided which can be screwed to the partition plate.

By virtue of the above-mentioned structure of the microwave multistage amplifier according to the present invention, the rooms in the casing are strictly separated from each other and the surface wave mode of the microwave propagation in the dielectric substrate is suppressed, thereby assuring a strict isolation between the amplifiers.

BEST MODE FOR CARRYING OUT THE INVENTION

Referring to the attached drawings, a microwave multistage amplifier according to an embodiment of the present invention will be described below.

Figure 1:
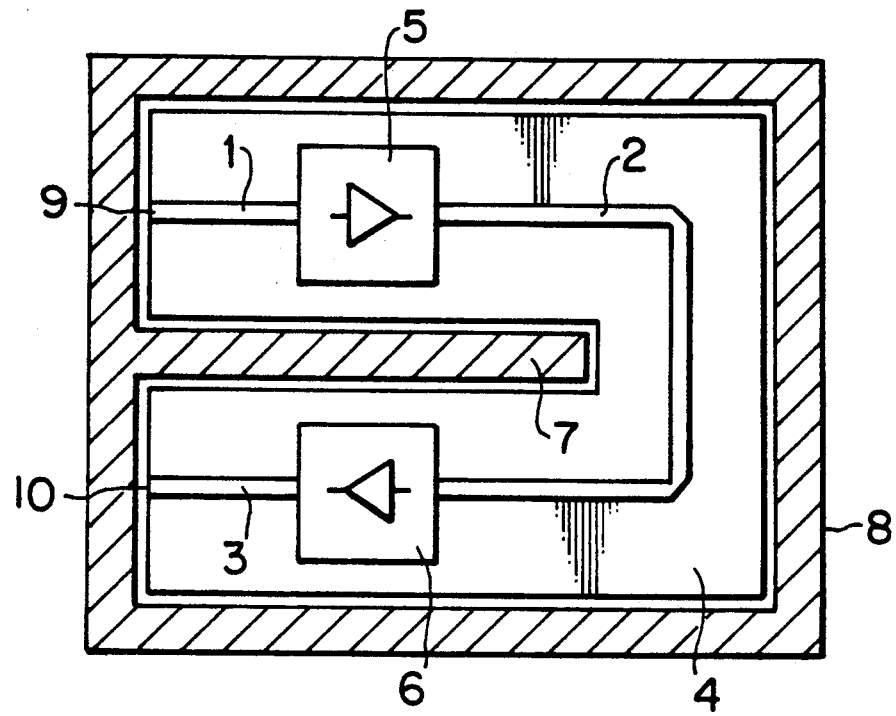
FIG. 1 is a plan view of a microwave multistage amplifier according to an embodiment of the present invention.
Figure 2:
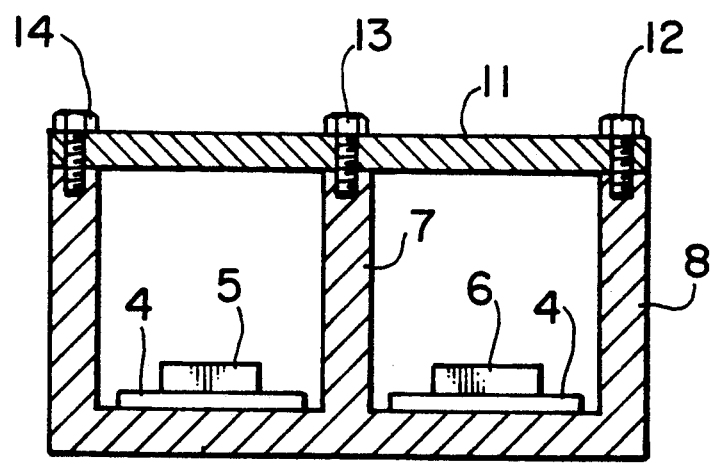
FIG. 2 is a sectional view of the important portion of the amplifier shown in FIG. 1.

FIG. 1 shows a microwave multistage amplifier, and FIG. 2 is a sectional view of the same amplifier.

In FIGS. 1 and 2, numerals 1, 2 and 3 denote microstrip lines, and numeral 4 a dielectric substrate for forming a microwave circuit. A microwave signal inputted through an input terminal 9 is successively amplified by microwave amplifier 5 and then microwave amplifier 6 and outputted through an output terminal 10. Since the dielectric substrate 4 is divided by a partition plate 7 constructed integrally with a shield casing 8, a surface wave mode propagating on the dielectric substrate 4 is prevented and no electrical connection occurs between the micro strip lines 1 and 3. Further, since an upper plate 11 is directly screwed to the partition plate 7 and the casing 8 by means of screws 12, 13 and 14, respectively, the two rooms, as shown in FIG. 2, are completely separated from each other by three conductive members, namely, the shield case 8 the upper cover plate 11 and the partition plate 7.

According to the above mentioned embodiment, by integrally moulding the partition plate 7 with the shield casing 8 and screwing the upper cover plate 11 to the partition plate 7, the rooms in the casing can be spatially separated from each other, thereby suppressing the surface wave mode propagation on the dielectric substrate 4 and making it possible to provide a stable microwave multistage amplifier having a superior isolation feature.

Next, another embodiment of the present invention will be described below by referring to the attached drawings.

Figure 3:
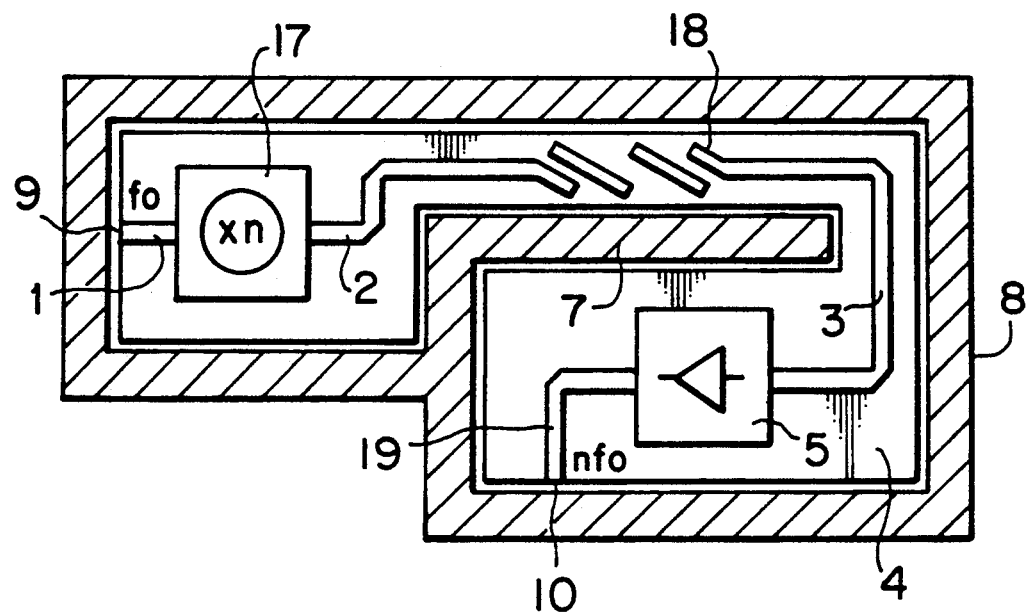
FIG. 3 is a plan view of a microwave amplifier of N'th order frequency multiplier according to another embodiment of the present invention.
Figure 4:
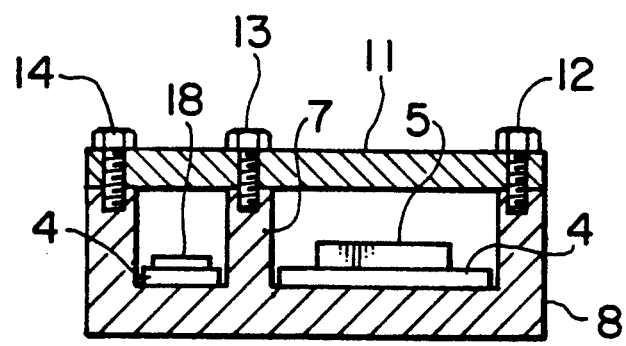
FIG. 4 is a sectional view of the important portion of the amplifier shown in FIG. 3.
Figure 5:
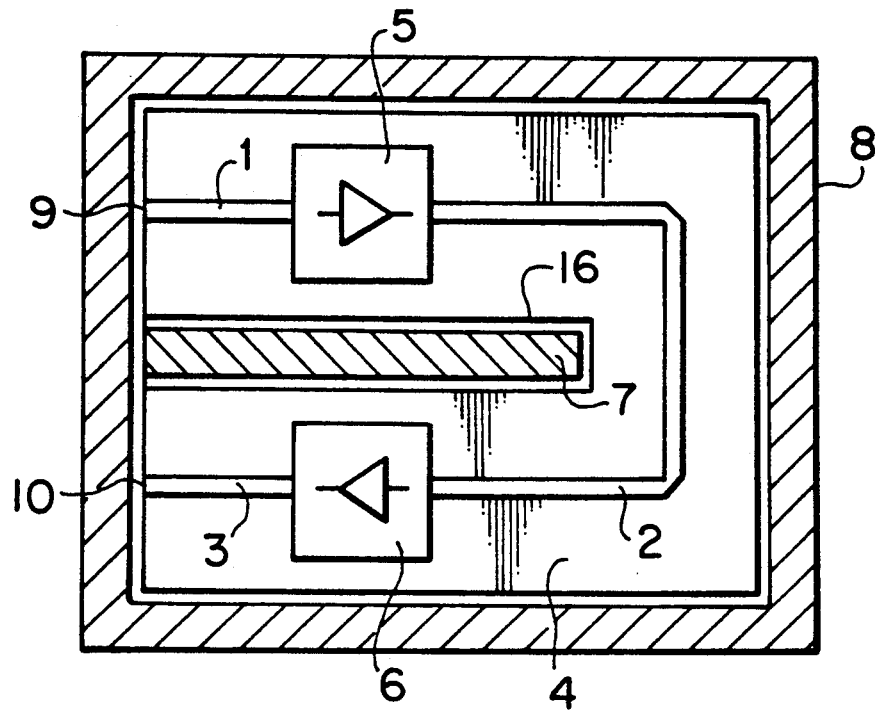
FIG. 5 is a plan view of a conventional microwave multistage amplifier.
Figure 6:
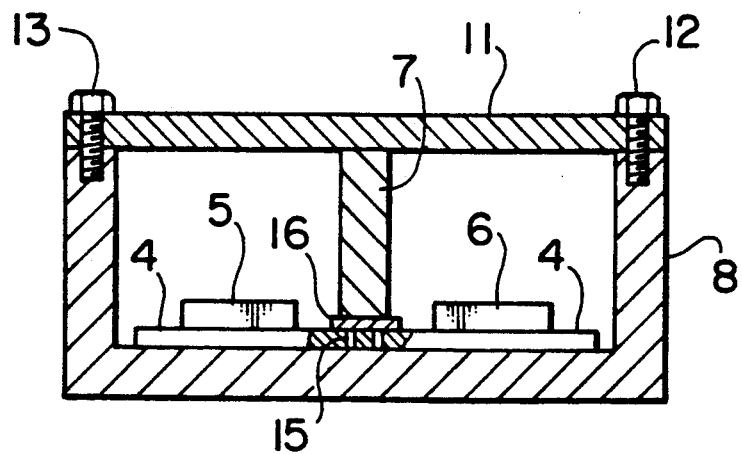
FIG. 6 is a sectional view of the important portion of the amplifier shown in FIG. 5.

FIG. 3 is a plan view of a microwave frequency n-th order multiplier according to the another embodiment of the present invention. FIG. 4 is a sectional view of the multiplier of FIG. 3.

In FIGS. 3 and 4, numerals 1, 2, 3 and 19 denote micro strip lines provided on a dielectric substrate 4. A microwave signal of a frequency $f_o$ is inputted through an input terminal 9 and is transformed into a microwave including harmonics generated by operation of a microwave frequency n-th order multiplier 17, and the N'th order harmonic of frequency $nf_c$ is separated by means of a band-pass filter 18 of half-wavelength coupling type. Then, for raising the potential level of the higher harmonic $nf_o$, the harmonic is amplified by the microwave amplifier 5 and then, outputted through an output terminal 10 as a microwave of frequency $nf_o$.

Especially, in a frequency multiplier, a plurality of harmonics are generated each having a frequency defined by multiplying the original frequency $f_o$ by an integer number. The harmonics other than that of frequency $nf_o$ are required to be adequately removed. According to the above-mentioned embodiment of the present invention, it is possible to spatially separate the rooms in the casing from each other by providing a partition plate 7 moulded integrally with a shield casing 8 and screwing an upper cover plate 11 to the partition plate 7 and the shield casing 8 by use of screws 12, 13 and 14, respectively, thereby making it possible to assure sufficient isolation between the rooms. Further, by suitably selecting the distance between the partition plate 7 and each of the side walls of the shield casing 8 and the height from the bottom of the shield casing 8 to the upper cover plate 11 at the region where the band-pass filter 18 of a half-wavelength coupling type is located for the purpose of utilizing a cut-off mode of a rectangular waveguide, it becomes possible to decrease the microwave power loss assumed in the microwave propagation through this region and to enhance the capability of removing undesired harmonics.

INDUSTRIAL APPLICABILITY

As mentioned above, a microwave multistage amplifier according to the present invention is practically useful in that the each room accommodating a microwave amplifier in the shield casing can be strictly separated from the other rooms by arranging a partition plate therebetween and screwing an upper cover plate to the partition plate, and as a result, any surface mode microwave propagation on the dielectric substrate can be suppressed, thereby assuring a significant isolation between the input side and the output side of the multistage amplifier.

What is claimed is:

1. A multi-stage microwave device comprising:
   a shield casing having an open end;
   a dielectric substrate disposed in said casing and having a first arm, a second arm and a connecting portion, said first arm and said second arm projecting from said connecting portion and being spaced apart from one another so as to define a recess therebetween, said connecting portion inter-connecting said first arm to said second arm;
   a first circuit element disposed on said first arm;
   a second circuit element disposed on said second arm;
   a partition plate integral with said shield casing and disposed within said recess; and
   an upper cover plate secured to said partition plate and closing said open end of said shield casing.

2. A multi-stage microwave device according to claim 1, wherein said shield casing and said partition plate are formed in a one piece configuration.

3. A multi-stage microwave device according to claim 1, wherein at least one of said first circuit element and said second circuit element is a microwave amplifier.

4. A multi-stage microwave amplifier according to claim 1, wherein said first circuit element is a bandpass filter and said second circuit element is a microwave amplifier.

* * * * *